US011587835B2

(12) United States Patent
Chen et al.

(10) Patent No.: US 11,587,835 B2
(45) Date of Patent: Feb. 21, 2023

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chun-Jen Chen, Tainan (TW); Tien-I Wu, Taoyuan (TW); Yu-Shu Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 51 days.

(21) Appl. No.: 17/337,446

(22) Filed: Jun. 3, 2021

(65) Prior Publication Data

US 2021/0287944 A1   Sep. 16, 2021

Related U.S. Application Data

(60) Continuation of application No. 16/676,370, filed on Nov. 6, 2019, now Pat. No. 11,062,953, which is a division of application No. 15/885,834, filed on Feb. 1, 2018, now Pat. No. 10,510,609.

(30) Foreign Application Priority Data

Jan. 5, 2018 (CN) .......................... 201810010463.4

(51) Int. Cl.
*H01L 21/8234* (2006.01)
*H01L 21/324* (2006.01)
*H01L 27/088* (2006.01)
*H01L 29/06* (2006.01)
(Continued)

(52) U.S. Cl.
CPC .. *H01L 21/823431* (2013.01); *H01L 21/3247* (2013.01); *H01L 21/823412* (2013.01); *H01L 21/823481* (2013.01); *H01L 27/0886* (2013.01); *H01L 29/0653* (2013.01); *H01L 29/1037* (2013.01); *H01L 29/7854* (2013.01)

(58) Field of Classification Search
None
See application file for complete search history.

(56) References Cited

U.S. PATENT DOCUMENTS 8,742,508 B2   6/2014   Cheng
9,362,358 B2   6/2016   Shih
9,553,025 B2   1/2017   Wann
(Continued)

FOREIGN PATENT DOCUMENTS

CN   103035517 A   4/2013
CN   103730365 A   4/2014
JP      5213519 B2   6/2013

*Primary Examiner* — Long Pham
(74) *Attorney, Agent, or Firm* — Winston Hsu

(57) ABSTRACT

A method for fabricating semiconductor device includes the steps of providing a substrate having a first region and a second region, forming a first fin-shaped structure on the first region and a second fin-shaped structure on the second region, and forming a shallow trench isolation (STI) around the first fin-shaped structure and the second fin-shaped structure. Preferably, the first fin-shaped structure and the second fin-shaped structure comprise different radius of curvature and a center of curvature of the first fin-shaped structure is lower than a top surface of the STI and a center of curvature of the second fin-shaped structure is higher than the top surface of the STI.

7 Claims, 4 Drawing Sheets

(51) Int. Cl.
*H01L 29/10* (2006.01)
*H01L 29/78* (2006.01)

(56) References Cited

U.S. PATENT DOCUMENTS

| | | |
|---|---|---|
| 9,673,198 B2 * | 6/2017 | Kim .................... H01L 29/7854 |
| 9,899,393 B2 | 2/2018 | Chung |
| 10,510,609 B2 | 12/2019 | Chen |
| 2009/0269916 A1 | 10/2009 | Kang et al. |
| 2010/0015773 A1 | 1/2010 | Park |
| 2013/0320453 A1 | 12/2013 | Pethe |
| 2019/0198681 A1 | 6/2019 | Hayashi |
| 2019/0214306 A1 | 7/2019 | Chen |
| 2020/0075418 A1 | 3/2020 | Chen |

* cited by examiner

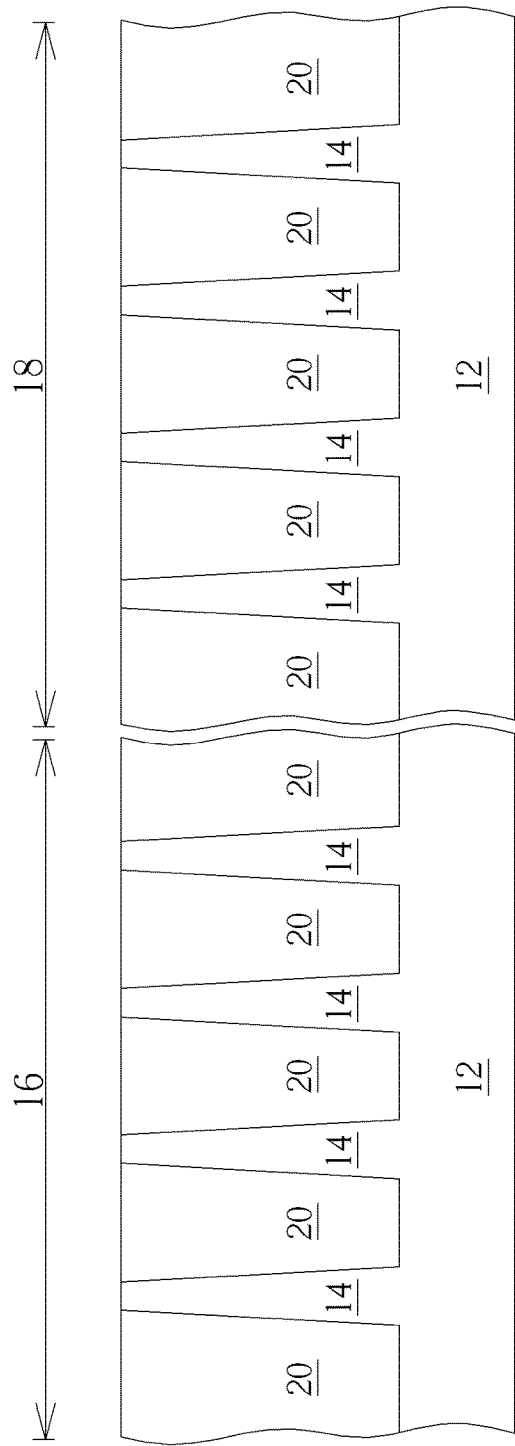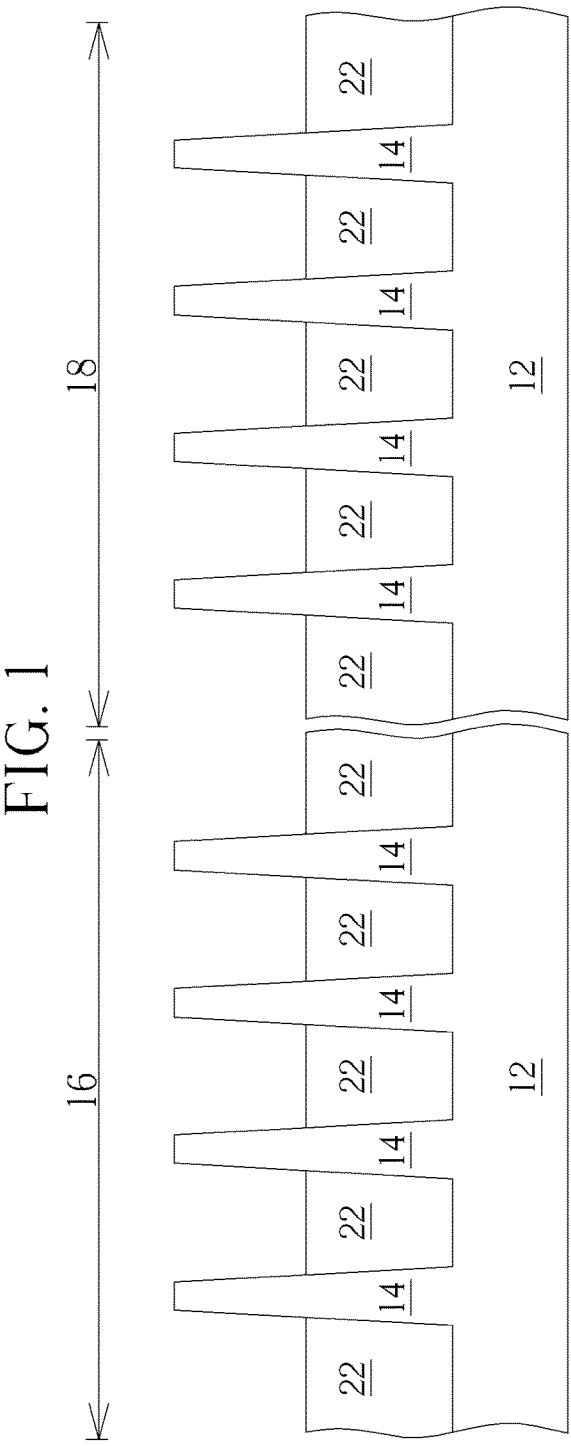

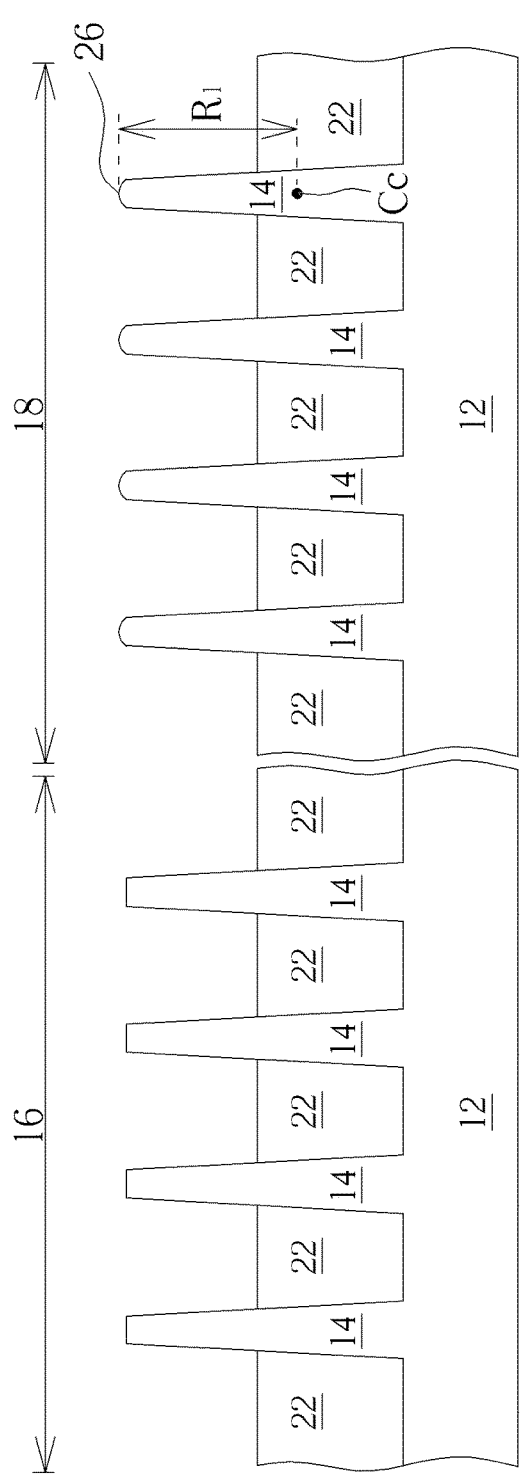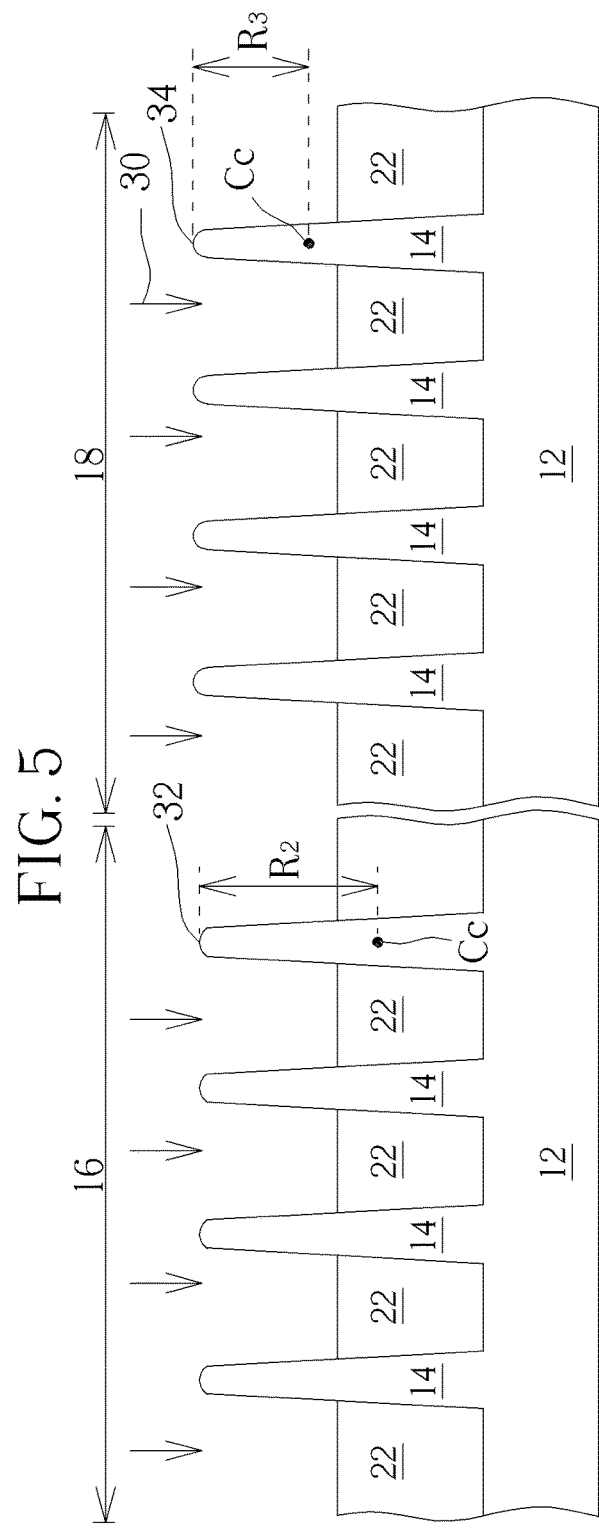

SEMICONDUCTOR DEVICE AND METHOD FOR FABRICATING THE SAME

CROSS REFERENCE TO RELATED APPLICATIONS

This is a continuation application of U.S. patent application Ser. No. 16/676,370, filed on Nov. 6, 2019, which is a division of U.S. patent application Ser. No. 15/885,834, filed on Feb. 1, 2018, all of which are hereby incorporated by reference in their entirety.

BACKGROUND OF THE INVENTION

1. Field of the Invention

The invention relates to a method for fabricating semiconductor device, and more particularly to a method of using anneal process to form fin-shaped structures with different radius of curvature.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to an embodiment of the present invention, a method for fabricating semiconductor device includes the steps of providing a substrate having a first region and a second region, forming a first fin-shaped structure on the first region and a second fin-shaped structure on the second region, and forming a shallow trench isolation (STI) around the first fin-shaped structure and the second fin-shaped structure. Preferably, the first fin-shaped structure and the second fin-shaped structure comprise different radius of curvature and a center of curvature of the first fin-shaped structure is lower than a top surface of the STI and a center of curvature of the second fin-shaped structure is higher than the top surface of the STI.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 illustrate a method for fabricating semiconductor device according to an embodiment of the present invention.

DETAILED DESCRIPTION

Figure 3:
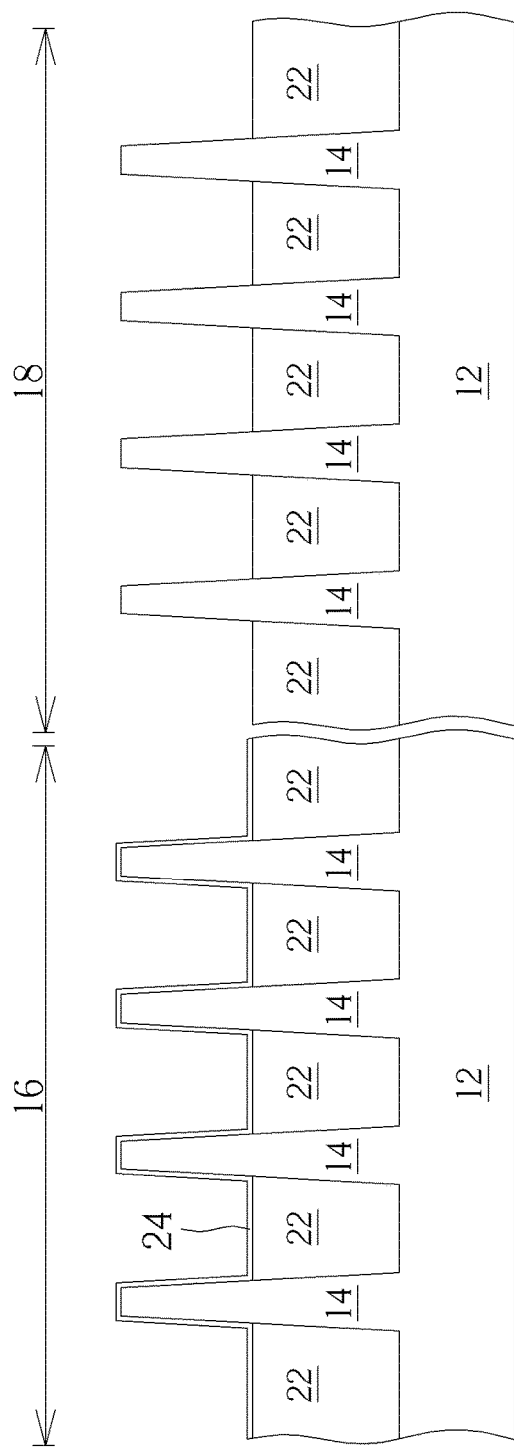

Referring to FIGS. 1-7, FIGS. 1-7 illustrate a method for fabricating semiconductor device according to an embodiment of the present invention. As shown in FIG. 1, a substrate 12, such as a silicon substrate or silicon-on-insulator (SOI) substrate is first provided and a plurality of fin-shaped structures 14 are formed on the substrate 12. In this embodiment, a first region 16 and a second region 18 are defined on the substrate 12, in which the first region 16 and the second region 18 are preferably used to fabricate devices having different electric fields in the later process. It should be noted that even though four fin-shaped structures 14 are formed on each of the first region 16 and the second region 18 in this embodiment, the number of the fin-shaped structures could be adjusted according to the demand of the product.

According to an embodiment of the present invention, the fin-shaped structures 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, a shallow trench isolation (STI) is formed around the fin-shaped structures 14. In this embodiment, the formation of the STI 14 could be accomplished by first conducting a flowable chemical vapor deposition (FCVD) process to form an insulating layer 20 made of silicon oxide on the substrate 12 and covering the fin-shaped structures 14 entirely. Next, a planarizing process including but not limited to for example a chemical mechanical polishing (CMP) process is conducted to remove part of the insulating layer 20 so that the top surface of the remaining insulating layer 20 is even with the top surface of the fin-shaped structures 14.

Next, as shown in FIG. 2, an etching process is conducted to remove part of the insulating layer 20 so that the top surface of the remaining insulating layer 20 is slightly lower than the top surface of the fin-shaped structures 14 on the first region 16 and second region 18. This forms the STI 22 around the fin-shaped structures 14.

Next, as shown in FIG. 3, a mask layer 24 is formed on the fin-shaped structures 14 on the first region 16 and the second region 18, and a photo-etching process or pattern transfer process is conducted to remove part of the mask layer 24 on the second region 18. For instance, it would be desirable to first form a patterned mask (not shown) such as patterned resist to cover the mask layer 24 on the first region 16 and then conduct an etching process by using the patterned resist as mask to remove the mask layer 24 on the second region 18 not covered by the patterned resist. This forms a patterned mask layer 24 on the first region 16 and at the same time exposes the fin-shaped structures 14 on the second region 18, and the patterned resist is stripped thereafter. In this embodiment, the mask layer 24 preferably includes silicon nitride and the etching process conducted to remove part of the mask layer 24 could include etchant including but not limited to for example phosphoric acid. It should be noted that none of the fin-shaped structures 14 is damaged as part of the mask layer 24 on the second region 18 is removed during the aforementioned etching process so that after the mask layer 24 is removed, the top surface of each of the fin-shaped structures 14 on the second region 18 preferably includes a planar surface.

Figure 4:
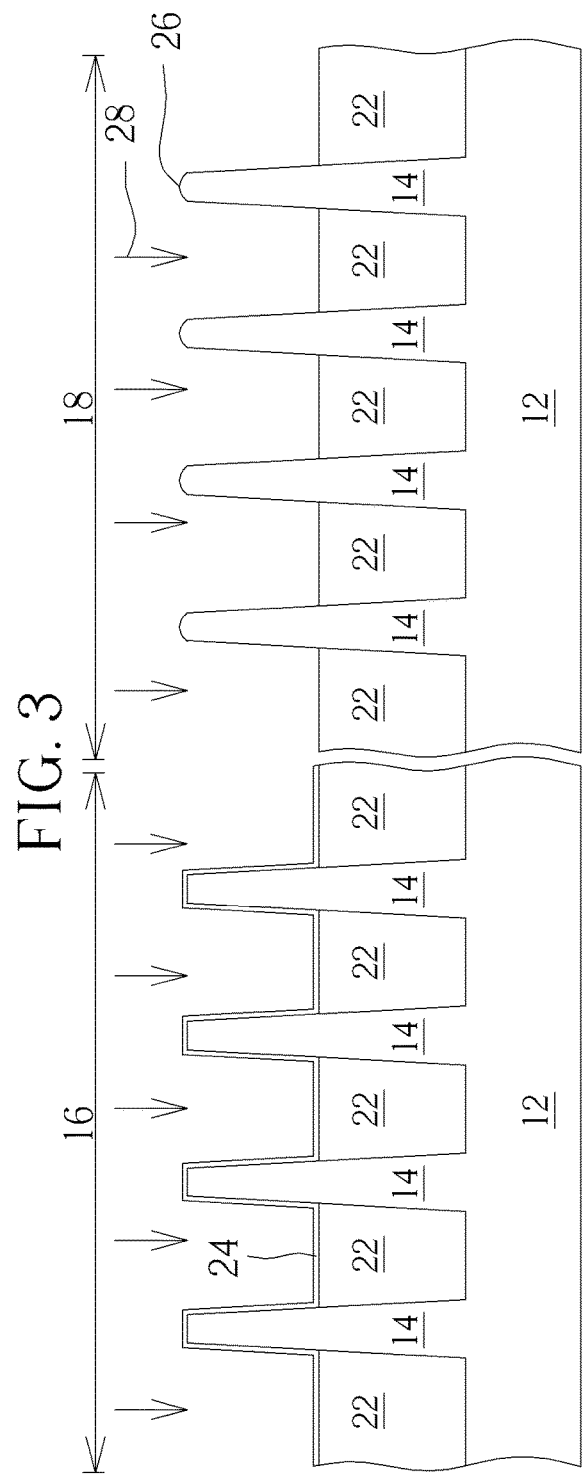

Next, as shown in FIG. 4, a first anneal process 28 is conducted to induce a silicon migration on the tip of each of the fin-shaped structures 14 not covered by the mask layer 24 so that the profile of the top surface of the fin-shaped structures 14 not covered by the mask layer 24 is altered and at the same time the electric field and performance of the fin-shaped structures 14 are also adjusted. Specifically, as the fin-shaped structures 14 on the first region 16 are covered by the mask layer 24 before the anneal process is conducted, the tip or topmost surface of each of the fin-shaped structures 14 on the second region 18 is transformed into a first curved surface 26 during the first anneal process 28 while the fin-shaped structures 14 on the first region 16 remain unchanged. In other words, silicon migration was occurred only on the tip of the fin-shaped structures 14 on the second region 18 to transform the planar topmost surface of each of the fin-shaped structures 14 into a curved surface during the first anneal process 28 as the tip of the fin-shaped structures 14 on the second region 18 are not covered or protected by the mask layer 24. No silicon migration however was occurred on the tip of each of the fin-shaped structures 14 on first region 16 so that the tip of each of the fin-shaped structures 14 on the first region 16 preferably remains unchanged or planar after the first anneal process 28. In this embodiment, the temperature of the first anneal process 28 is preferably between 700° C. to 850° C. and the pressure of the first anneal process 28 is preferably between 5 Torr to 300 Torr, but not limited thereto.

Next, as shown in FIG. 5, an etching process is conducted preferably without forming extra patterned mask to remove the mask layer 24 on the first region 16 and expose the fin-shaped structures 14 underneath. In this embodiment, the etching process conducted to remove the mask layer 24 could include etchant including but not limited to for example phosphoric acid.

It should be noted the tip or topmost surface of each of the fin-shaped structures 14 on the first region 16 and the second region 18 preferably includes a radius of curvature ($R_c$) at this stage, in which the radius of curvature in this embodiment is defined as distance measured from any point from the tip or topmost surface of each fin-shaped structure 14 to a center of curvature ($C_c$). As shown in the structure in FIG. 5, since the topmost surface of each of the fin-shaped structures 14 on the first region 16 is a planar surface, the radius of curvature ($R_c$) of each fin-shaped structure 14 on the first region 16 is infinite. The top surface of each of the fin-shaped structures 14 on second region 18 however is transformed from planar surface to first curved surface 26 during the aforementioned first anneal process 28, hence a first radius of curvature $R_1$ could be obtained by measuring the distance from any point on the first curved surface 26 to a center of curvature ($C_c$) for each of the fin-shaped structures 14. At this stage, as the radius of curvature of each fin-shaped structure 14 on the first region 16 is infinitely large, the first radius of curvature ($R_1$) of each fin-shaped structure 14 on the second region 18 is preferably less than the radius of curvature of each fin-shaped structure 14 on the first region 16.

Next, as shown in FIG. 6, a selective second anneal process 30 could be conducted without forming any extra mask to transform the profile of the tip of each of the fin-shaped structures 14 once more and at the same time adjust the electrical field of the fin-shaped structures 14. Specifically, since no mask layer 24 is disposed on the fin-shaped structures 14 on the first region 16 at this stage, the second anneal process 30 preferably alters the profile of the topmost surface of fin-shaped structures 14 on both first region 16 and second region 18 at the same time. Preferably, the planar top surface on each of the fin-shaped structures 14 on the first region 16 is transformed into a second curved surface 32 and the first curved surface 26 on each of the fin-shaped structures 14 on second region 18 is transformed into a third curved surface 34, in which each of the second curved surface 32 and the third curved surface 34 being a completely curved surface without including any planar portion.

Viewing from a more detailed perspective regarding the change in the radius of curvature, since the planar topmost surface of each of the fin-shaped structures 14 on the first region 16 is transformed into a second curved surface 32 through the aforementioned second anneal process 30, a second radius of curvature $R_2$ could be obtained by measuring the distance from any point on the second curved surface 32 to a center of curvature ($C_c$). The topmost surface or first curved surface 26 with corresponding first radius of curvature $R_1$ of each of the fin-shaped structures 14 on the second region 18 on the other hand is transformed into a third curved surface 34 with third radius of curvature $R_3$ after the second anneal process 30. Specifically, the third radius of curvature $R_3$ of the third curved surface 34 is slightly less than the second radius of curvature $R_2$ and the first radius of curvature $R_1$ while the second radius of curvature $R_2$ and the first radius of curvature $R_1$ remain substantially the same. For instance, it would also be desirable to adjust the parameter of the fabrication process to obtain second radius of curvature $R_2$ that may be slightly less than or greater than the first radius of curvature $R_1$, which are all within the scope of the present invention. It should also be noted that the first radius of curvature $R_1$, second radius of curvature $R_2$, and the third radius of curvature $R_3$ shown in FIGS. 5-6 are not drawn to actual scale but merely demonstrate a comparison between relative sizes of different radius of curvatures. Similar to the aforementioned embodiment, the temperature of the second anneal process 30 is preferably between 700° C. to 850° C. and the pressure of the second anneal process 30 is preferably between 5 Torr to 300 Torr, but not limited thereto.

Figure 7:
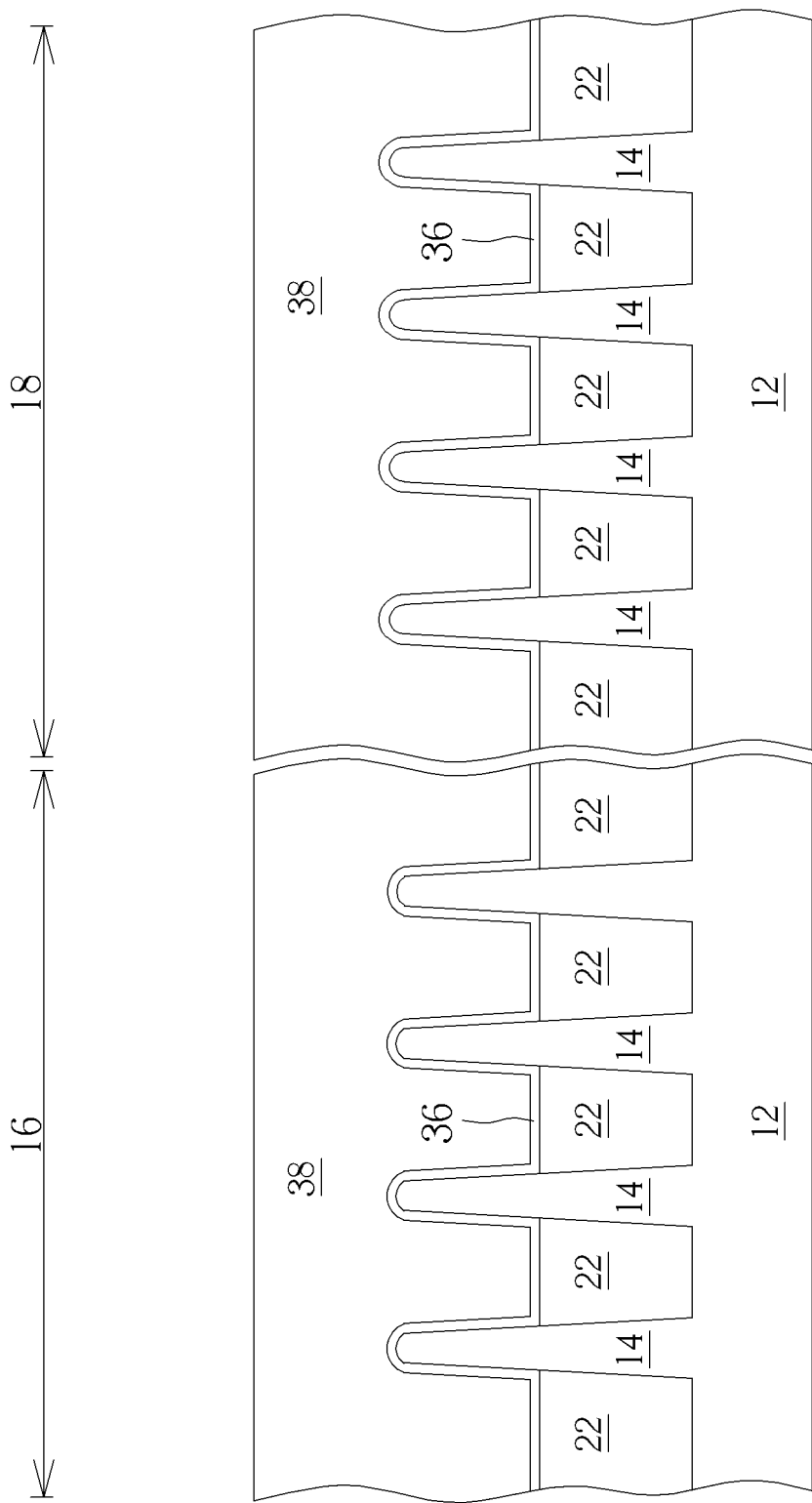

Next, as shown in FIG. 7, a transistor fabrication process could be conducted thereafter by sequentially forming a gate dielectric layer 36 and a gate material layer 38 made of polysilicon on the fin-shaped structures 14 on the first region 16 and second region 18, performing a photo-etching process on the gate material layer 38 to form gate structures, and then forming transistor elements such as spacers and source/drain regions adjacent to two sides of the gate structure. It should be noted that even though the gate dielectric layer 36 and the gate material layer 38 are formed on the fin-shaped structures 14 after the second anneal process 30 is completed, it would also be desirable to directly form the gate dielectric layer 36 and gate material layer 38 on the fin-shaped structures 14 as soon as the mask layer 24 is removed in FIG. 5 and then conduct follow-up transistor fabrication process thereafter, which is also within the scope of the present invention.

Overall, the present invention first forms a plurality of fin-shaped structures on a first region and second region of a substrate, form a STI around the fin-shaped structures, and then form a mask layer to cover the fin-shaped structures on the first region. Next, an anneal process is conducted by using high temperature to induce silicon migration on the tip of the fin-shaped structures not covered by the mask layer thereby altering the profile of the topmost surface of the fin-shaped structures so that the tip or topmost surfaces of the fin-shaped structures on the first region and second region would have different radius of curvature. By doing so, the electric field and performance of the fin-shaped structures on each of the first region and the second region could be adjusted accordingly to produce fin-shaped structures suitable for different products.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a first region and a second region;
    forming a first fin-shaped structure on the first region and a second fin-shaped structure on the second region, wherein the first fin-shaped structure and the second fin-shaped structure comprise different radius of curvature; and
    forming a shallow trench isolation (STI) around the first fin-shaped structure and the second fin-shaped structure, wherein a center of curvature of the first fin-shaped structure is lower than a top surface of the STI and a center of curvature of the second fin-shaped structure is higher than the top surface of the STI.

2. The method of claim 1, further comprising:
    forming an insulating layer around the first fin-shaped structure and the second fin-shaped structure; and
    removing part of the insulating layer to form the STI.

3. The method of claim 1, wherein a lower end of the first fin-shaped structure is even with a lower end of the second fin-shaped structure.

4. The method of claim 1, wherein a portion of a bottom surface of the STI in the first region is even with a portion of the bottom surface of the STI in the second region.

5. The method of claim 1, wherein a portion of the top surface of the STI in the first region is even with a portion of the top surface of the STI in the second region.

6. The method of claim 1, further comprising:
    performing a first anneal process to transform a top surface of the second fin-shaped structure into a first curve so that the first fin-shaped structure and the second fin-shaped structure comprise the different radius of curvature.

7. The method of claim 2, further comprising:
    forming the insulating layer around the first fin-shaped structure and the second fin-shaped structure, wherein a top surface of the insulating layer is even with a top surface of the first fin-shaped structure and a top surface of the second fin-shaped structure; and
    removing the part of the insulating layer to form the STI.

* * * * *